(12) United States Patent
Mizumura (10) Patent No.: US 9,069,251 B2
(45) Date of Patent: Jun. 30, 2015

(54) SCANNING EXPOSURE APPARATUS USING A PLURALITY OF MICROLENS ARRAYS WITH ADJUSTABLE INCLINATION

(75) Inventor: Michinobu Mizumura, Yokohama (JP)

(73) Assignee: V TECHNOLOGY CO., LTD., Yokohama-Shi, Kanagawa (JP)

( * ) Notice: Subject to any disclaimer, the term of this patent is extended or adjusted under 35 U.S.C. 154(b) by 258 days.

(21) Appl. No.: 13/816,462

(22) PCT Filed: Jul. 22, 2011

(86) PCT No.: PCT/JP2011/066646
§ 371 (c)(1),
(2), (4) Date: Feb. 11, 2013

(87) PCT Pub. No.: WO2012/023381
PCT Pub. Date: Feb. 23, 2012

(65) Prior Publication Data
US 2013/0135602 A1   May 30, 2013

(30) Foreign Application Priority Data

Aug. 19, 2010   (JP) ................. 2010-184457

(51) Int. Cl.
*G03B 27/68*   (2006.01)
*G03B 27/52*   (2006.01)
*G03F 7/20*   (2006.01)

(52) U.S. Cl.
CPC .......... *G03F 7/2002* (2013.01); *G03F 7/70258* (2013.01); *G03F 7/70275* (2013.01); *G03F 7/70358* (2013.01); *G03F 7/201* (2013.01)

(58) Field of Classification Search
CPC ... G03F 7/2002; G03F 7/201; G03F 7/70258; G03F 7/70275; G03F 7/70358

USPC .......... 355/67, 68, 55, 53, 18, 77, 52; 356/399–401, 614; 264/401; 425/174.4; 250/492.22, 492.23, 548
See application file for complete search history.

(56) References Cited

U.S. PATENT DOCUMENTS

2005/0190353 A1   9/2005   Gui et al.
2005/0243295 A1   11/2005   de Jager et al.
(Continued)

FOREIGN PATENT DOCUMENTS

JP   9-244255 A   9/1997
JP   2005-244238 A   9/2005
(Continued)

OTHER PUBLICATIONS

International Search Report in PCT/JP2011/066646 dated Oct. 25, 2011.

*Primary Examiner* — Peter B Kim
*Assistant Examiner* — Michelle Iacoletti
(74) *Attorney, Agent, or Firm* — McGinn IP Law Group, PLLC (57) ABSTRACT

A scanning exposure apparatus using microlens arrays, includes a plurality of microlens arrays is arrayed in a direction perpendicular to a scanning direction above a substrate to be exposed, and the microlens arrays are supported on a support substrate. The microlens arrays can be supported on a support substrate so as to be capable of being inclined from a direction parallel to the exposure substrate, relative to the direction in which the microlens arrays are arranged. The inclination angles of these microlens arrays are configured so as to gradually increase or decrease along the arrangement direction.

7 Claims, 5 Drawing Sheets

(56) References Cited

U.S. PATENT DOCUMENTS

| | | |
|---|---|---|
| 2005/0243298 A1 | 11/2005 | de Jager et al. |
| 2006/0138358 A1 | 6/2006 | Lof et al. |
| 2006/0139601 A1 | 6/2006 | Hoogenraad |
| 2006/0256309 A1 | 11/2006 | Gui et al. |

FOREIGN PATENT DOCUMENTS

| | | |
|---|---|---|
| JP | 2005-317970 A | 11/2005 |
| JP | 2006-191031 A | 7/2006 |
| JP | 2006-191060 A | 7/2006 |
| JP | 2007-003829 A | 1/2007 |
| JP | 2008-292916 A | 12/2008 |
| JP | 2011-118155 A | 6/2011 |

SCANNING EXPOSURE APPARATUS USING A PLURALITY OF MICROLENS ARRAYS WITH ADJUSTABLE INCLINATION

TECHNICAL FIELD

The present invention relates to a scanning exposure apparatus using microlens arrays, wherein mask patterns are exposed on a substrate by microlens arrays in which microlenses are arrayed two-dimensionally.

BACKGROUND ART

With thin-film transistor liquid crystal substrates, color filter substrates, and other substrates, a resist film or the like formed on a glass substrate undergoes overlay exposure multiple times to form predetermined patterns. These exposed substrates sometimes expand and contract in the film-forming process, and the lower layer pattern of the overlay exposure sometimes differs from the designed pitch depending on the manufacturing conditions (the exposure apparatus characteristics and temperature conditions). In this type of overlay exposure, when there is a change in the pitch of the exposed positions, the magnification in the exposure apparatus must be corrected to absorb this change in pitch. Specifically, when there is a fluctuation in the dimensions of the exposed substrate, the image magnification must be adjusted to thereby arrange the image in the portion of pitch misalignment to be in the center of a predetermined position of the pitch on the substrate after the fluctuation.

Recently, there has been proposed a scanning exposure apparatus using microlens arrays in which microlenses are arranged two-dimensionally (Patent Document 1). In this scanning exposure apparatus, a plurality of microlens arrays is arrayed in one direction, and a substrate and mask are moved in a direction perpendicular relative to the arraying direction in relation to the microlens arrays and the exposure light source, whereby the exposure light scans the mask and exposure patterns formed in holes in the mask are imaged on the substrate.

PRIOR ART DOCUMENTS

Patent Documents

Patent Document 1: Japanese Laid-open Patent Application No. 2007-3829

DISCLOSURE OF THE INVENTION

Problems the Invention is Intended to Solve

However, this conventional scanning exposure apparatus has the following problems. In an exposure apparatus using a projection optical device that uses a combination of normal lenses, the magnification is easily adjusted by methods such as adjusting the spaces between lenses. However, in the case of microlenses, the magnification cannot be adjusted because eight lenses are arranged along the optical axis in a plate 4 mm thick, for example, whereby erected equal-magnification images are imaged on the substrate. Consequently, a problem with a scanning exposure apparatus using microlens arrays is that the apparatus cannot address variations in the pitch of the exposed substrate.

An object of the present invention is to provide a scanning exposure apparatus using microlens arrays, wherein images of mask patterns can be aligned with predetermined positions even if large fluctuations in the exposed substrate occur due to fluctuations in the exposure apparatus characteristics, temperature conditions, and other manufacturing conditions.

Means for Solving the Problems

A scanning exposure apparatus using microlens arrays according to the present invention comprises a plurality of microlens arrays arranged above a substrate to be exposed and having microlenses in a two-dimensional arrangement, a mask arranged above the microlens arrays and having predetermined exposure patterns formed therein, an exposure light source for radiating exposure light onto the mask, and a movement device for moving the microlens arrays and the substrate and mask relative to each other in one direction; the microlens arrays being arranged above a support substrate in a direction perpendicular to the one direction, and the microlens arrays being supported so as to be capable of being inclined relative to the support substrate from a direction parallel to the substrate to be exposed when viewed in the arrangement direction thereof.

The microlens arrays can be configured so that the inclination angles thereof either increase or decrease gradually along the arrangement direction.

Furthermore, two rows of the microlens arrays are preferably arranged in the one direction, and the microlens arrays are preferably arranged staggered on the support substrate. However, it is not absolutely necessary that the microlens arrays be arranged in a staggered manner.

Furthermore, the microlenses project erected equal-magnification images of the exposure patterns of the mask onto the substrate, for example.

Furthermore, the inclination angles of the microlens arrays can be adjusted so that the total pitch of a lower layer pattern already formed on the substrate to be exposed is measured in advance and the pitch of the exposure patterns is aligned with the total pitch of the lower layer pattern.

Effects of the Invention

According to the present invention, in an exposure apparatus using microlens arrays, a plurality of microlens arrays is made to have different inclination angles from each other, whereby the magnification of erected equal-magnification images transmitted through the microlenses can easily be seemingly varied, and the dimensional precision of the exposure positions in overlay exposure can be improved.

BRIEF DESCRIPTION OF THE DRAWINGS

FIGS. 4(a) and (b) are drawings showing diaphragm stops thereof;

BEST MODE FOR CARRYING OUT THE INVENTION

Embodiments of the present invention will be described in detail hereinbelow with reference to the attached drawings.

Figure 1:
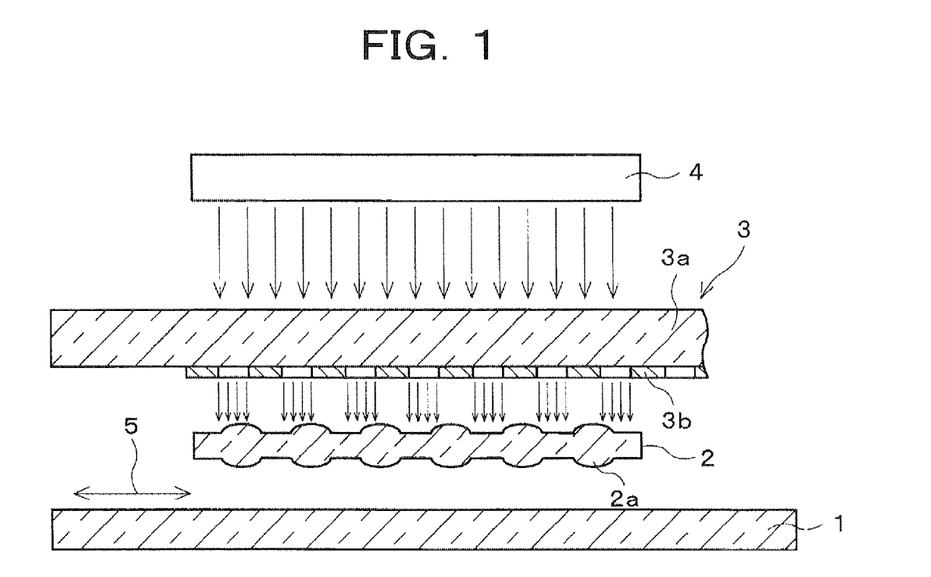
FIG. 1 is a longitudinal cross-sectional view showing part of one microlens array of an exposure apparatus according to an embodiment of the present invention.
Figure 2:
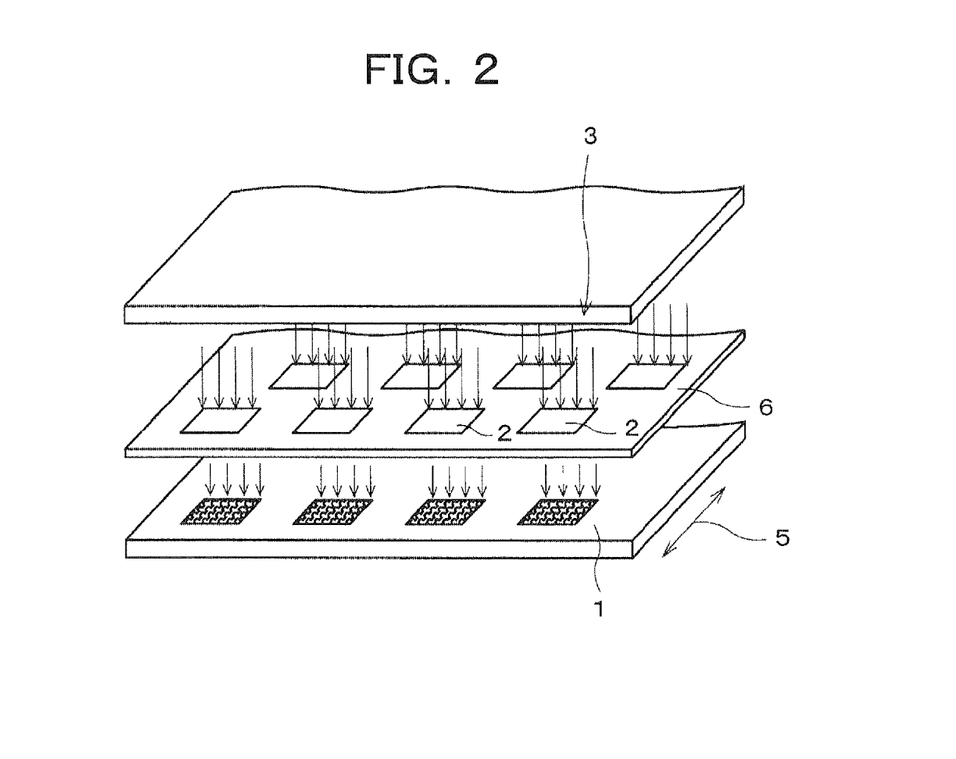
FIG. 2 is a perspective view showing an array of a plurality of these microlens arrays.
Figure 3:
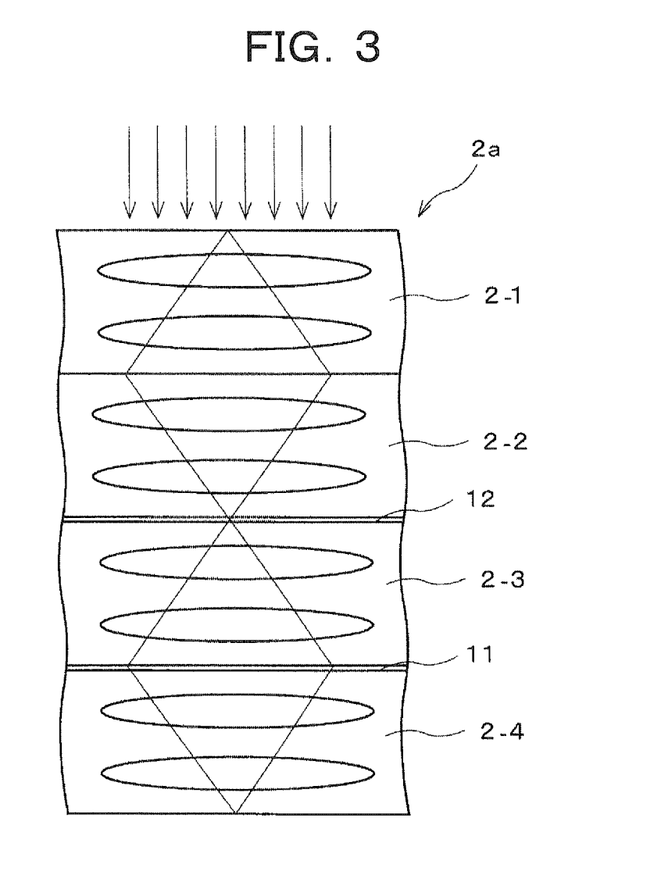
FIG. 3 is a drawing showing microlenses.
Figure 4:
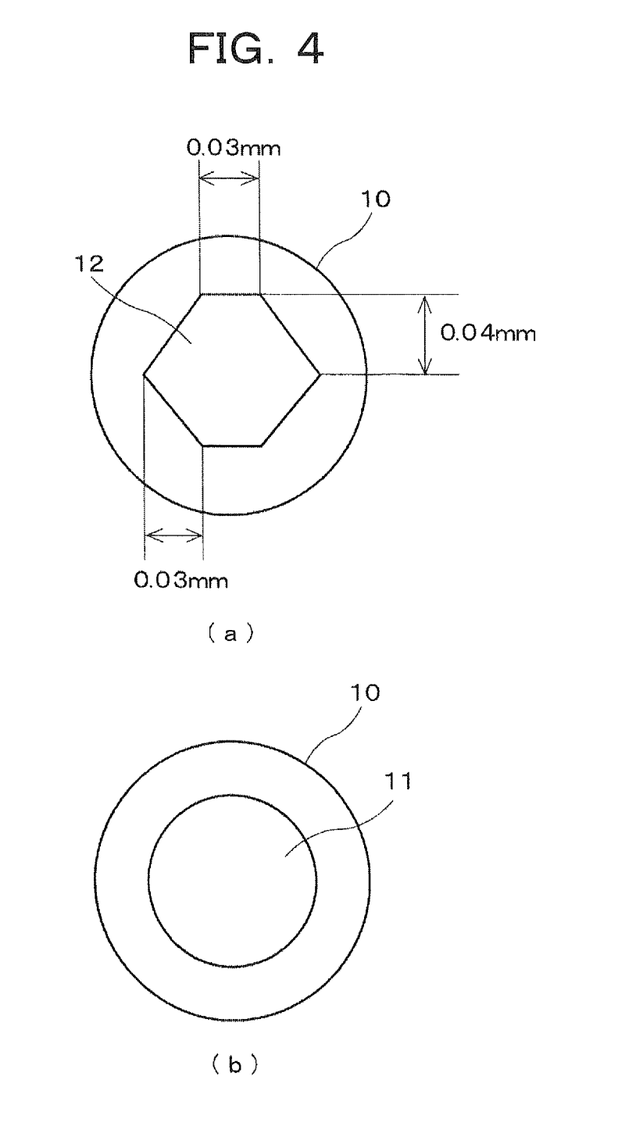
Figure 5:
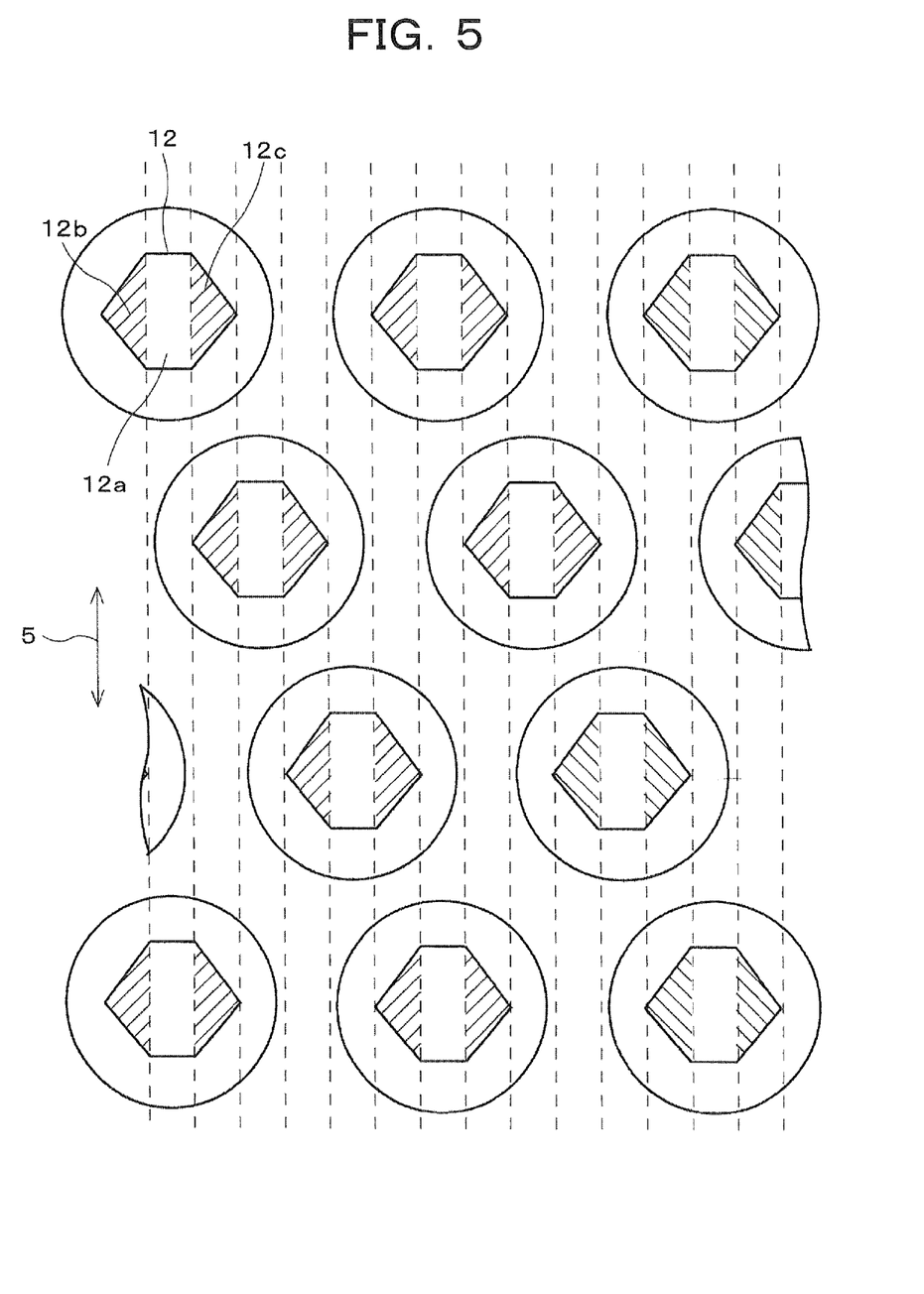
FIG. 5 is a drawing showing exposure areas of microlens arrays.
Figure 6:
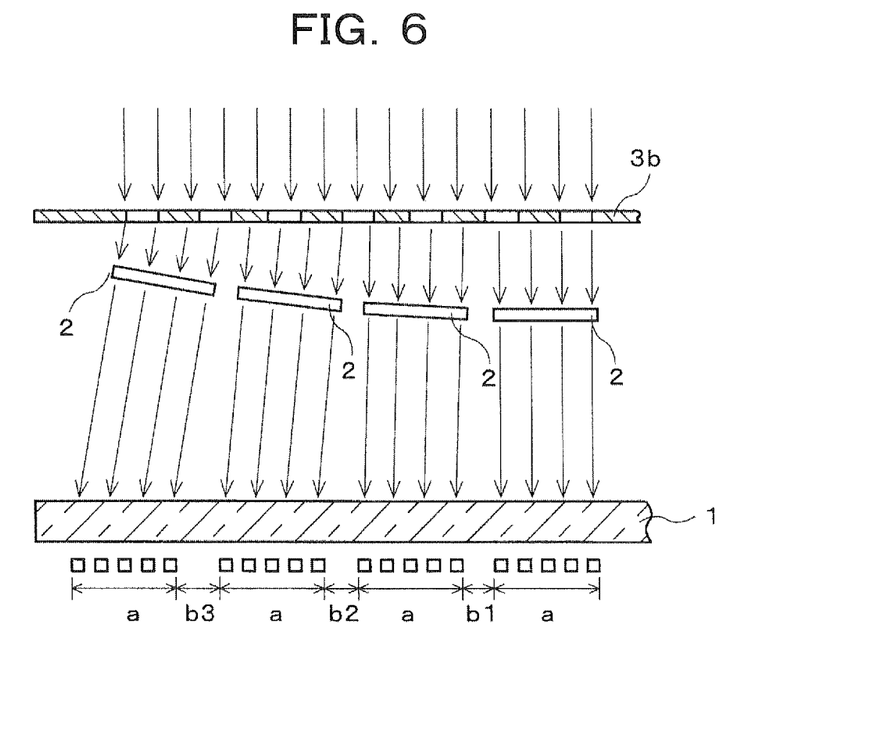
FIG. 6 is a drawing showing the relationship between microlens arrays.

FIG. 1 is a longitudinal cross-sectional view showing part of one microlens array of an exposure apparatus according to an embodiment of the present invention, FIG. 2 is a perspective view showing an array of a plurality of these microlens arrays, FIG. 3 is a drawing showing microlenses, FIGS. 4(a) and (b) are drawings showing diaphragm stops thereof, FIG. 5 is a drawing showing exposure areas of microlens arrays, and FIG. 6 is a drawing showing the relationship between microlens arrays.

Arranged above a glass substrate or another substrate 1 to be exposed is a microlens array 2 configured from a two-dimensional arrangement of microlenses 2a, a mask 3 is arranged above this microlens array 2, and an exposure light source 4 is arranged above the mask 3. A light-blocking film composed of a Cr film 3b is formed on the bottom surface of a transparent substrate 3a of the mask 3, and exposure light is transmitted through holes formed in the Cr film 3b and made by the microlens array 2 to converge on the substrate. In the present embodiment, the microlens array 2 and the exposure light source 4 are fixed in place, for example, and the substrate 1 and mask 3 move synchronously in the direction of the arrow 5, whereby exposure light from the exposure light source 4 is transmitted through the mask 3 and the substrate 1 is scanned in the direction of the arrow 5. The movement of the substrate 1 and the mask 3 is driven by the drive source of a suitable movement device. Another option is to fix the substrate 1 and mask 3 in place and to move the microlens array 2 and the exposure light source 4.

Microlens arrays 2 are arranged on a support substrate 6 in a direction perpendicular to the scanning direction 5, in two rows of four, for example, as shown in FIG. 2. Viewing these microlens arrays 2 in the scanning direction 5, three of the four rear microlens arrays 2 are arranged between the four front microlens arrays 2, and the two rows of microlens arrays 2 are staggered. The exposure areas in a direction perpendicular to the scanning direction 5 on the substrate 1 are thereby entirely exposed by the two rows of microlens arrays 2.

Each of the microlens arrays 2 has a configuration of 4×8 microlenses 2a, and the microlenses have a structure in which four microlens arrays 2-1, 2-2, 2-3, 2-4 are stacked. Each of the microlens arrays 2-1 is configured from two lenses. Exposure light is thereby briefly made to converge between the microlens arrays 2-2 and the microlens arrays 2-3, and is then imaged on the substrate underneath the microlenses 2-4. Hexagonal field stops 12 are arranged between the microlens arrays 2-2 and the microlens arrays 2-3, and aperture stops 11 are arranged between the microlens arrays 2-3 and the microlens arrays 2-4. The hexagonal field stops 12 and aperture stops 11 are provided in each of the microlenses 2a, and the parts of the exposure areas on the substrate underneath the microlenses 2a are shaped into hexagons. The hexagonal field stops 12 are formed as hexagonal apertures in the lens field areas 10 of the microlenses 2a as shown in FIG. 4(a), for example, and the aperture stops 11 are formed as circular apertures in the lens field areas 10 of the microlenses 2a as shown in FIG. 4(b). The hexagonal field stops 12 have the dimensions (millimeters) shown in FIG. 4(a), for example.

In the microlens arrays 2, the microlenses 2a are arranged as shown in FIG. 5. Specifically, the microlenses 2a are arranged sequentially in the scanning direction 5 and are slightly staggered in the transverse direction. The hexagonal field stops 12 are divided into rectangular portions 12a in the centers, and triangular portions 12b, 12c on the sides as seen along the scanning direction 5. Viewed along the scanning direction 5, the microlenses 2a are arranged so that the triangular portions 12c on the right sides of the first row of hexagonal field stops 12 overlap the triangular portions 12b on the left sides of the second row of hexagonal field stops 12, and the triangular portions 12b on the left sides of the first row of hexagonal field stops 12 overlap the triangular portions 12c on the right sides of the third row of hexagonal field stops 12, as shown in FIG. 5. Thus, viewed along the scanning direction 5, the microlenses 2a are arranged so that three rows constitute one set. In other words, the fourth row of microlenses 2a is arranged in the same position as the first row of microlenses 2a as viewed along the direction perpendicular to the scanning direction 5. At this time, when the shape of the hexagonal field stops 12 has the same dimensions as those shown in FIG. 4, the line segments (dashed lines) joining the corners of the hexagons are equal intervals of 0.03 mm as shown in FIG. 5. The sum of the surface area of one triangular portion 12b and the surface area of one triangular portion 12c is equal to the surface area of one center rectangular portion 12a. Therefore, when the substrate 1 is scanned over three rows of microlenses 2a, the substrate will have received a uniform quantity of exposure light in this entire area, as seen along the direction perpendicular to the scanning direction 5. Therefore, in the microlens arrays 2, a number of rows of microlenses 2a equal to an integral multiple of three is arranged in the scanning direction 5.

The microlens arrays 2 are supported on the support substrate 6, but the microlens arrays 2 are also supported on the support substrate 6 so as to be capable of being inclined in the direction perpendicular to the scanning direction 5, as shown in FIG. 2.

The four microlens arrays 2 in each row, for a total of eight, can be inclined at any desired inclination angle relative to the direction perpendicular to the scanning direction, as shown in FIG. 6. The microlens arrays 2 can thus be driven at an incline by piezoelectric elements. Specifically, when a voltage is applied to the piezoelectric elements, the piezoelectric elements deform according to the applied voltage, and the angles of the microlens arrays 2 can be varied using this deformation. FIG. 6 alternately shows the front microlens arrays 2 and rear microlens arrays 2 of FIG. 2, and the front and rear microlens arrays 2 are seen along the scanning direction 5. Therefore, FIG. 6 shows half of the microlens arrays 2 of FIG. 2.

The following is a description of the action of the exposure apparatus of the present embodiment described above. When exposure light from the exposure light source 4 is incident on the microlens arrays 2 via the mask 3 as shown in FIGS. 1 through 3, inverted equal-magnification images are imaged on the hexagonal field stops 12. The exposure light transmitted through the microlenses 2a is shaped by the hexagonal field stops 12 into hexagons as shown in FIG. 4(a), and is projected as erected equal-magnification images on the substrate 1 as shown in FIG. 5.

The exposure areas on the substrate 1 in the direction perpendicular to the scanning direction 5 are entirely exposed with a uniform quantity of light by the eight microlens arrays 2 as shown in FIG. 2. When the substrate 1 and the mask 3 are scanned in the scanning direction 5 relative to the microlens arrays 2, the exposure areas on the substrate 1 are entirely exposed with a uniform quantity of light. The mask patterns formed in the mask 3 are thereby imaged on the substrate 1.

At this time, when the manufacturing process causes variation in dimensions among thin-film transistor liquid crystal substrates and glass substrates such as color filter substrates, the exposure patterns in overlay exposure deviate from the lower layer pattern. In view of this, when the substrate 1 to be exposed is large in size, the microlens arrays 2 are inclined relative to adjacent microlens arrays 2 as shown in FIG. 6. The microlens array 2 farthest to the right in FIG. 6 is parallel to the substrate 1 to be exposed and the exposure light incident on this microlens array 2 is perpendicular, but the next microlens array 2 to the left is slightly inclined (about several thousandths of a degree) relative to the right end microlens array 2. The exposure light transmitted through this microlens array 2 is incident on the substrate 1 in a direction slightly inclined from the perpendicular direction. The next microlens array 2 to the left is more inclined relative to the right microlens array 2 in the same manner, whereby the farthest microlens array 2 to the left is inclined the most relative to the perpendicular direction, and exposure light is incident on the substrate 1 at the greatest incline from the perpendicular direction.

The mask patterns (shown as squares in the drawings) of the mask 3 projected on the substrate 1 from the microlens arrays 2 are thereby projected onto the areas a corresponding to the microlens arrays 2. In this case, the inclination angle of exposure light differs with each of the microlens arrays 2, but the exposure areas a have substantially the same dimensions as the microlens arrays 2 because the inclination angles themselves are extremely small. However, the spaces b1, b2, and b3 between adjacent microlens arrays 2 are larger than the spaces would be in a case of the microlens arrays 2 being parallel to the substrate 1. Therefore, the transmitted areas of the exposure light when the light is transmitted through the mask 3 are larger in the substrate 1, and the effect is that the lens magnification increases substantially. Images of the mask patterns can thereby be imaged in the centers of predetermined exposure areas on an expanded substrate, and these images can be imaged in the centers of the predetermined exposure areas in the same manner as in cases of no fluctuation in the dimensions of the substrate.

When the dimension of the glass substrate 1 in the direction perpendicular to the scanning direction 5 is 1 m and the dimensions of the microlens arrays 2 are 60 mm, seventeen microlens arrays 2 are needed in order to expose all the areas of the substrate 1. A substrate 1 of this size will expand or contract about 6 μm from the design values, depending on manufacturing conditions (the exposure apparatus characteristics and temperature conditions). Therefore, by slightly inclining the microlens arrays 2 one by one and thereby increasing the spaces between the microlens arrays 2 by 0.375 μm (6/16=0.375) in comparison with a case of the microlens arrays being horizontal, the magnification of the exposure areas of the projection exposure can be seemingly increased, and fluctuations in the dimensions of the substrate 1 can be absorbed. Since the spaces between adjacent microlens arrays 2 are preferably revised by 0.375 μm in this manner, the angles by which the microlens arrays 2 are inclined remain extremely small if this extent of change is made to the spaces.

Thus, in an exposure apparatus that uses microlens arrays, the magnification of the projected images can be easily changed, and the dimension precision of overlay exposure can be improved.

The microlens arrays are supported on the support substrate via piezoelectric elements, for example, so as to be inclined from being parallel to the substrate to be exposed in relation to the direction in which they are arranged on the support substrate, and the inclination angles of the microlens arrays are set so as to gradually increase in relation to the arrangement direction in the embodiment above, but the inclination angles of the microlens arrays may also conversely be set so as to gradually decrease. In this case, when the substrate to be exposed has been reduced in size, the positions of exposure light leaving the microlens arrays can be aligned with the substrate after it has fluctuated in size.

As described above, according to the present invention, exposure positions can be aligned with high precision with the exposure pattern of the lower layer even if there are fluctuations in the dimensions of the substrate during overlay exposure. To be specific, however, one possible option is to measure the total pitch of the lower layer pattern in advance, and to adjust the inclination angles of the microlenses and finely adjust the pattern projected positions so as to align the pitches of the exposure patterns with the total pitch. Another possible option is to not measure the pitch of the lower layer pattern in advance, to use a camera to confirm positional misalignment between the lower layer pattern and the exposure patterns during exposure in the exposure apparatus, and to adjust the inclination angles of the microlenses in real time on the basis of the result. The term "total pitch" refers to the distance between the patterns at the ends in the direction perpendicular to the scanning direction 5.

Examples that can be used as the exposure light include pulse laser light, the continuous light of a mercury lamp or the like, and various others.

INDUSTRIAL APPLICABILITY

The present invention makes it possible to easily absorb pitch fluctuation in the lower layer pattern in a scanning exposure apparatus when overlay exposure is performed, because the exposure magnification of the microlens arrays can be adjusted.

[Key]
1: substrate
2: microlens arrays
2a: microlenses
2-1 to 2-4: (configured) microlens arrays
3: mask
3a: transparent substrate
3b: Cr film
4: exposure light source
5: scanning direction
6: support substrate
11: aperture stops
12: hexagonal field stops
12a: rectangular portions
12b, 12c: triangular portions

The invention claimed is:
1. A scanning exposure apparatus using microlens arrays, the scanning exposure apparatus comprising:
   a plurality of microlens arrays arranged above a substrate to be exposed and comprising microlenses in a two-dimensional arrangement;
   a mask arranged above the microlens arrays and comprising predetermined exposure patterns formed therein;
   an exposure light source for radiating exposure light onto the mask; and
   a movement device for moving said microlens arrays and said substrate and mask relative to each other in one direction,
   said plurality of microlens arrays being arranged on a support substrate in a direction perpendicular to said one direction, and each of the microlens arrays being supported so as to be capable of, in use, being inclined relative to said support substrate via an inclination on a plane perpendicular to said one direction.
2. The scanning exposure apparatus using microlens arrays according to claim 1, wherein inclination angles of said microlens arrays either increase or decrease gradually along said arrangement direction.
3. The scanning exposure apparatus using microlens arrays according to claim 2, wherein two rows of said microlens arrays are arranged in said one direction, and said each of the microlens arrays is arranged staggered on said support substrate.

4. The scanning exposure apparatus using microlens arrays according to claim 2, wherein said microlenses project erect equal-magnification images of the exposure patterns of said mask onto said substrate.

5. The scanning exposure apparatus using microlens arrays according to claim 1, wherein two rows of said microlens arrays are arranged in said one direction, and said each of the microlens arrays is arranged staggered on said support substrate.

6. The scanning exposure apparatus using microlens arrays according to claim 5, wherein said microlenses project erect equal-magnification images of the exposure patterns of said mask onto said substrate.

7. The scanning exposure apparatus using microlens arrays according to claim 1, wherein said microlenses project erect equal-magnification images of the exposure patterns of said mask onto said substrate.

* * * * *